United States Patent [19]

Hurwitt

[11] Patent Number: 5,237,756
[45] Date of Patent: Aug. 24, 1993

[54] METHOD AND APPARATUS FOR REDUCING PARTICULATE CONTAMINATION

[75] Inventor: Steven D. Hurwitt, Park Ridge, N.J.
[73] Assignee: Materials Research Corporation, Orangeburg, N.Y.
[21] Appl. No.: 573,845
[22] Filed: Aug. 28, 1990
[51] Int. Cl.$^5$ ............................................. F26B 5/04
[52] U.S. Cl. ........................................ 34/15; 34/92; 34/22; 156/345
[58] Field of Search ................ 34/10, 22, 23, 36, 37, 34/92, 58, 15, 218; 156/345

[56] References Cited

U.S. PATENT DOCUMENTS

| | | |
|---|---|---|
| 4,532,970 | 8/1985 | Tullis et al. . |
| 4,544,446 | 10/1985 | Cady . |
| 4,718,975 | 1/1988 | Bowling et al. . |
| 4,816,081 | 3/1989 | Mehta et al. ........................ 34/92 X |
| 4,857,132 | 8/1989 | Fisher . |
| 4,936,940 | 6/1990 | Kawasumi et al. ..................... 34/58 |
| 4,943,457 | 7/1990 | Davis et al. . |
| 4,966,669 | 10/1990 | Sadamori et al. . |

FOREIGN PATENT DOCUMENTS

| | | |
|---|---|---|
| 0067705 | 6/1982 | European Pat. Off. . |
| 0136562 | 8/1984 | European Pat. Off. . |
| 60-96755 | 9/1985 | Japan . |
| 1-163377 | 9/1990 | Japan . |

OTHER PUBLICATIONS

Balder and Cachon, I.B.M. Technical Disclosure, Diverter Flow Bernoulli Pick Up Device Oct. 1979.

Primary Examiner—Henry A. Bennett
Attorney, Agent, or Firm—Wood, Herron & Evans

[57] ABSTRACT

A pressure sealed chamber such as a load lock for a apparatus for processing substrates is provided with a guide plate spaced from a substrate supported therein so as to form a gap which covers the substrate surface to be protected from particulate contamination. During the filling of the chamber and during the evacuation of the chamber, by either pumping or venting, clean gas is introduced through an orifice in the center of the plate so as to flow outwardly from the edge of the gap at a pressure sufficient to deflect or otherwise reduce the number of turbulent gas borne particulates in the chamber from entering the gap and contaminating the surface to be protected of the substrate. During the filling of the chamber, all or some of the gas filling the chamber is introduced through the gap. During the evacuation of the chamber, gas is introduced through the gap at a flow rate less that of the evacuating gas.

27 Claims, 1 Drawing Sheet

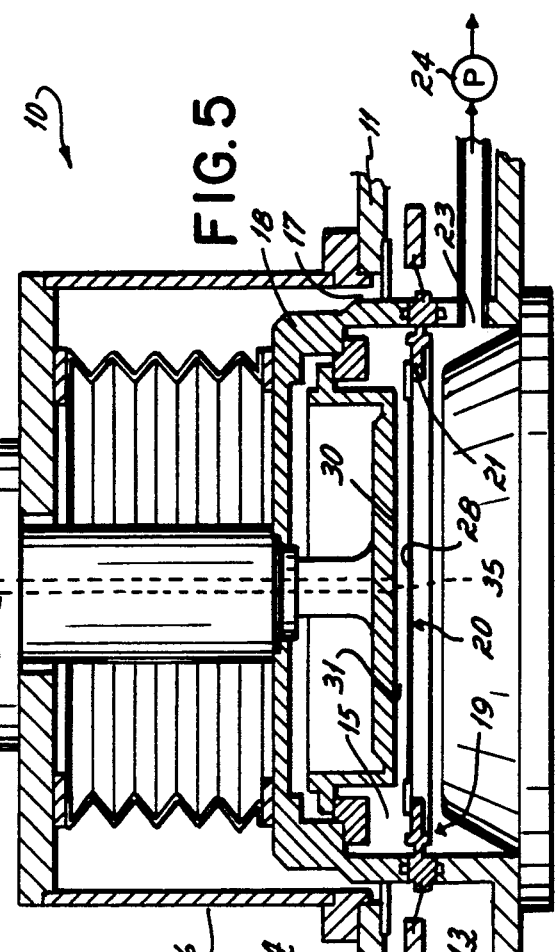
FIG. 5
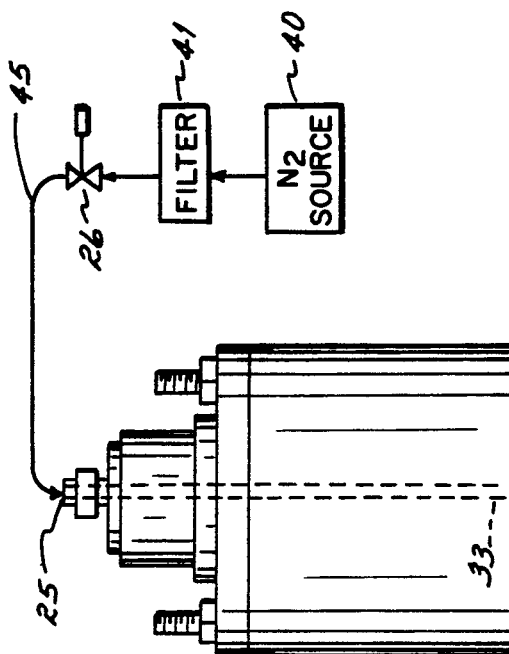
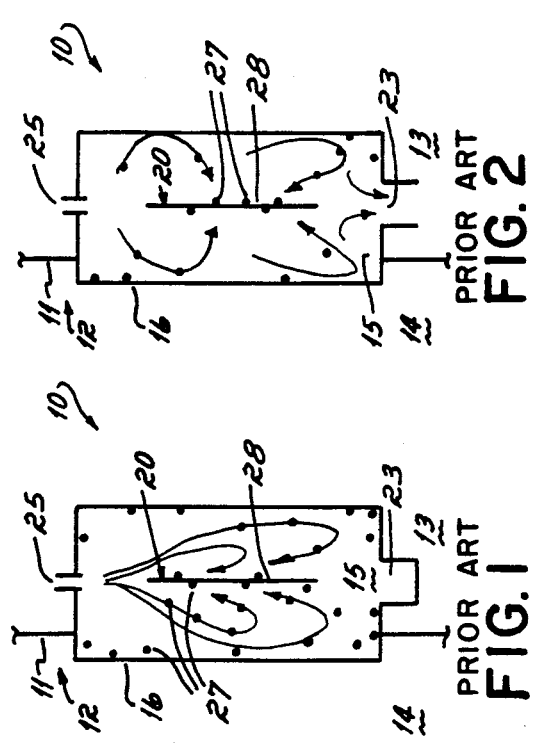
FIG. 1 PRIOR ART
FIG. 2 PRIOR ART
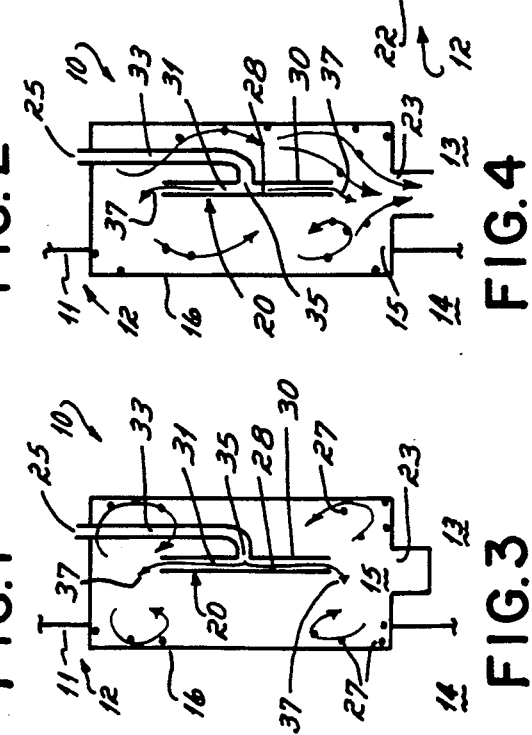
FIG. 3
FIG. 4

METHOD AND APPARATUS FOR REDUCING PARTICULATE CONTAMINATION

The present invention relates to pressure sealed chambers and, more particularly, to the reduction of the contamination of objects in chambers of processing machines by particulates disturbed by the turbulent flow of gases during the evacuation and refilling of the chambers.

BACKGROUND OF THE INVENTION

In the manufacture of semiconductor devices and other articles through coating or etching processes performed on wafers and other substrates, it is imperative that the contamination, by microscopic particles, of the substrate surfaces to be processed be minimized. Surfaces to be protected from such contamination include, for example, the device surfaces of semiconductor wafers. The device surfaces are the surfaces of the wafers on which layers of conductive, insulative or other material are coated or etched by sputtering or other processes to form the manufactured devices.

In such processes, the presence of minute microscopic particulates on the device surface of a wafer may render an entire device functionally defective by adversely affecting the application or removal of a component layer at a critical point on the wafer surface. Similarly, magnetic disks, optical disks, lenses, magneto-optical disks and other such objects may be substantially reduced in value or quality where the number of particulates that contact the surface during processing is high. In the manufacture of large scale integrated circuits, a large quantity of semiconductor devices is formed of a single wafer. In the processing of such wafers, the number of microscopic particles present on the device surface of a wafer during processing significantly reduce the number of such devices of acceptable quality produced.

In a semiconductor processing apparatus such as a typical sputter coating or sputter etching machine, a wafer substrate is processed in an isolated and usually near vacuum environment. Such machines have a vacuum chamber in which the processing operations are carried out. The vacuum chamber is provided with one or more chamber doors located in the wall of the chamber through which wafers being processed are introduced and removed. On the outside of this chamber, the wafers are moved by some wafer handling mechanism between a cassette or carrier and the chamber door. A transfer mechanism which is usually included in the external wafer handling mechanism introduces the wafers into and removes them from the vacuum chamber through the chamber door opening. In the vacuum chamber, the wafer is usually received and held by a holder that supports the wafer during processing.

During the entry and removal of the wafers from the vacuum chamber, the portion of the chamber into which the wafers are placed and from which the wafer is removed will necessarily be at the same pressure and of the same atmospheric environment as exists in the external environment outside the chamber door. During processing, however, the portion of the chamber in which the wafer is to be processed must be brought to the vacuum pressure and atmospheric content as the process requires. This change of atmospheres necessitates a repetitive opening and isolation of the internal and external environments and the alternate pumping and venting of at least a portion of the vacuum chamber.

Wafer processing machines that process wafers in a vacuum environment sometimes maintain a constant vacuum environment so that processing upon some wafers can be carried out as others are being inserted into or removed from the chamber. To this end, such machines have an intermediate chamber or load lock at the entry to the processing chamber that alternately communicates with the external environment through the open chamber door, and, when the door is sealed, with the internal environment of the processing chamber through a sealable entry thereto. Such a load lock is alternately pumped to the vacuum level of the internal environment of the main processing chamber and vented to the external environment so that the pressure of the load lock matches that of environment with which it communicates during the introduction into and removal from the processing chamber of the wafers. With such a load lock, the internal portion of the chamber where processes are carried out, may be maintained continuously at the pressure and composition of the vacuum environment and, may be used additionally, for the processing of other wafers while wafers are being introduced into and removed from the load lock chamber.

Some processing machines are provided with two load lock chambers, one for the introduction of unprocessed wafers into the main chamber and one for removal of processed wafers from the main chamber. To avoid delay of processing operations being carried out in a processing chamber while wafers are being exchanged through the load locks, each of the operations of pumping the chamber and venting the chamber must take place in one machine or processing cycle. Where a single load lock is provided, to avoid such delays both entry of wafers into and removal of wafers from the apparatus must occur sequentially in one such machine cycle. This cycle must encompass the venting of the chamber to the pressure of the external environment, the opening of the load lock chamber door, exchange of a processed wafer for an unprocessed wafer in the load lock, the closing of the chamber door, and a pumping of the load lock to the vacuum pressure level of the internal environment of the processing chamber.

Often, the wafer processing involves a number of processing steps, each performed at a different processing station within a main chamber of a single wafer processing apparatus. In such an apparatus, different processes may be performed simultaneously at different processing stations differently on different wafers. The duration of these steps may be viewed as one machine cycle. At the beginning of each cycle, the load lock doors to the external environment are closed, the load lock chamber is pumped to the vacuum level of the processing chamber and the load lock or load locks are opened to the main chamber. An unprocessed wafer is supported in a holder in the load lock chamber while one or more wafers, once fully processed, is held in the main chamber at a final processing station. With the main chamber open to the load lock or load locks, one unprocessed wafer is moved into the main chamber from a load lock while one fully processed wafer is moved from the main chamber to the same or another load lock. At the end of each cycle, the load lock chamber is isolated from the main chamber, vented to the external environment and then opened to the external environment so that the processed wafer can be removed.

The operation of the load lock of a wafer processing machine having a single load lock proceeds in a cycle that begins with an opening of the load lock to the main chamber, the movement of a processed wafer from the main chamber to the load lock chamber where it replaces an unprocessed wafer which is simultaneously moved to the main chamber from the load lock chamber, and the sealing of the load lock to isolate the load lock chamber the internal processing environment of the main chamber so that processing in the main chamber can proceed. Once sealed, the load lock chamber is vented to the external atmosphere at a flow rate which allows for the opening of the load lock door, exchange of a processed wafer for an unprocessed wafer and the pumping of the load lock back to the vacuum pressure level during the machine process cycle. Both the pumping and the venting of the load lock cause a turbulent flow of gas within the load lock chamber.

In this and other types of processing machines, gases are pumped and vented into or out of processing and other chambers in which wafers or other substrates are being held before, during or after processing. Turbulent gas flow is often unavoidable in such chambers. In chambers such as processing and etching chambers, for example, a turbulent flow of gas during pumping or venting may occur. In these chambers, too, particulates are disturbed and may move to surfaces of objects which must be protected from such particulate contamination.

In the course of gas flow into and out of the load lock and other chambers, minute microscopic particulates, which have unavoidably collected on surfaces within the chamber, are disturbed by the turbulence of the flowing gas. The turbulently flowing gas picks up and carries the disturbed particulates about the chamber. In the prior art, many of these particulates come into contact with the device surface of the wafer within the chamber. This turbulent redistribution of particulates about the load lock chamber occurs when the vented gas is introduced into the chamber prior to the removal of a processed wafer from the chamber, and in addition, when gas is pumped from the chamber after an unprocessed wafer has been inserted into the chamber prior to the processing of the wafer.

The contact of particulates with the device surfaces of wafers results in adhesion of the particles which in turn causes the likely formation of defective devices as the particles interfere with the coating and etching processes and the deposition and removal of semiconductor layers on the wafer.

Heretofore in the prior art, the effort to minimize the particle contamination of the surfaces of wafers and other such substrates has focused on the meticulous and thorough cleaning of the chambers and on efforts to maintain an ultraclean environment surrounding the apparatus to thereby reduce the introduction of contaminating particulates into the chambers. Such efforts have resulted in expensive and time consuming solutions to the particulate contamination problem.

Accordingly, there is a need to reduce the particulate contamination of semiconductor wafer disks, and other objects in load locks and other pressure chambers of processing machines when turbulent gas is flowing therein and to render the cleaning of chambers and the maintenance of a clean environment in the vicinity of machines employing such chambers less expensive and less critical.

SUMMARY OF THE INVENTION

It is a primary objective of the present invention to limit the particulate contamination of the critical surfaces of wafers and other objects in load locks and other pressure chambers. It is a more particular objective of the present invention to provide a method for venting a chamber that avoids the transporting of particulates disturbed by turbulent gas flow in the lock chamber to the surface to be subjected to processing of the object supported therein. It is a further objective of the present invention to provide a method of reducing contamination of such object surfaces during the pumping of a load lock or other pressure chamber. It is a still further objective of the present invention to provide a chamber, particularly a load lock chamber, that protects the surfaces of objects to be processed from particulate contamination during the venting or pumping of the chamber.

According to the principles of the present invention, clean gas is introduced into a chamber, during both the evacuation and the filling of the chamber, in such a way as to form a pressurized layer of the clean gas adjacent at least one surface to be protected of a object supported in the chamber. The pressurized layer of clean gas pneumatically shields the surface of the object from contamination by particulates borne by turbulent gas within the chamber.

According to the preferred embodiment of the present invention, shield or guide plate is maintained in close spaced, generally parallel, relationship with the object surface to be protected, at for example the front plane of a semiconductor wafer, supported in the chamber. The plate covers the entire device surface of the wafer to be processed, and in combination with the wafer device surface forms a gap between the plate and the surface to be protected adjacent the surface. Through an orifice in this plate, the clean gas is introduced during the filling of the chamber, as well as during the evacuation of the chamber. The pressure of the gas at the orifice is such as to maintain a positive pressure, with respect to the chamber environment, at the periphery of the gap around the edge of the surface being protected so that the clean gas flows from the orifice radially outwardly through the gap periphery, thereby preventing, or at least inhibiting, particles which become borne by the turbulent gas within the chamber from entering the gap and alighting on the protected surface. Viewed differently, the outward flow of gas from the gap periphery deflects turbulent gas-borne particles from entering the gap from the chamber and alighting on the device surface of the wafer.

The filling of the chamber is achieved, in accordance with a process of the present invention, either entirely by the gas vented into the chamber through the orifice in the plate as described above, or with additional vent gas which enters the chamber through another port.

Also in accordance with a preferred embodiment of the invention, evacuation of a chamber is achieved by pumping gas from the chamber while simultaneously introducing vent gas through the plate and into the gap adjacent the surface of the wafer. The gas introduced during the evacuation of the chamber is introduced at a flow rate sufficient to pressurize the gap between the plate and the surface to be protected at a level greater than that in the chamber. The introduction of such vent gas during the chamber pumping process is at a rate which is nonetheless small with respect to the pumping flow rate.

It has been found that, in a wafer processing machine, with the load lock only pumped and vented in accordance with the present invention, the number of particulates added to a wafer is reduced from, for example, approximately 45 particles per wafer to approximately 10. Also, with the present invention, less stringent standards for the cleaning of the chamber and area around the chamber may be employed.

While the preferred embodiments of the invention are described herein for use with machines in which the processes are carried out in a vacuum or negative pressure environment, certain of the principles described herein are applicable to processes which occur at elevated pressures. The specific problems solved and advantages realized by the invention are particularly applicable to vacuum processes, however, especially for sputter processing operations.

Furthermore, while the preferred embodiments of the invention are described in machines for coating or etching semiconductor wafers, the principles of the invention are applicable to machines and processes wherein other objects such as lenses, or magnetic, optical or magneto-optical disks are coated, etched or otherwise processed in chambers in which turbulent gas flow may be present during the pumping or venting of a chamber. With the present invention, various substrate surfaces including but not limited to the device surfaces of semiconductor wafers are protected from particulate contamination. The protection is important in chambers such as load-lock chambers which are pumped and vented regularly causing gas to flow turbulently within them. Other chambers such as reactive gas etching and sputter coating chambers are also pumped and vented, and will benefit from the present invention.

These and other objectives and advantages of the present invention will be more readily apparent from the following detailed description of the drawings in which:

BRIEF DESCRIPTION OF THE DRAWINGS

FIG. 1 is a diagram illustrating the venting of a load lock chamber of a vacuum processing apparatus, and showing the motion of turbulent gas and particulate contaminants borne by the gas within a load lock chamber constructed and operated according to the prior art.

FIG. 2 is a diagram similar to FIG. 1 illustrating the pumping of a load lock chamber of a vacuum processing apparatus, and the motion of turbulent gas and particulate contaminants borne by the gas within a load lock chamber constructed and operated according to the prior art.

FIG. 3 is a diagram showing the venting of a load lock chamber of a wafer processing apparatus constructed and operated in accordance with principles of the present invention.

FIG. 4 is a diagram showing the evacuation or pumping of a load lock chamber of a wafer processing apparatus constructed and operated in accordance with principles of the present invention.

FIG. 5 is a cross-sectional view illustrating the load lock chamber represented in the diagrams of FIGS. 3 and 4.

DETAILED DESCRIPTION OF THE DRAWINGS

A load lock according to one preferred embodiment of the present invention, and the method of filling the load lock, venting the load lock, and reducing particle contamination of wafers in the load lock, are particularly suitable for use in combination with a wafer processing apparatus such as the sputter coating and sputter etching apparatus disclosed in the commonly assigned U.S. Pat. Nos. 4,909,695 and 4,915,564, both entitled "Method and Apparatus for Handling and Processing Wafer-Like Materials," hereby expressly incorporated herein by reference.

These above incorporated patents describe, in pertinent part, a method and apparatus for processing wafers, particularly for the sputter coating and etching of semiconductor wafers, in the vacuum environment maintained within a main chamber of the machine. In the apparatus described in the above incorporated patents, wafers may be simultaneously and sequentially processed at a plurality of processing stations in the main vacuum processing chamber. In the main chamber, the wafers are held in a rotatable plate which indexes them in a circle among a plurality of angularly spaced stations, including a plurality of processing stations and a single load lock station at which is situated a load lock through which wafers are transported into and out of the main processing chamber and to and from an external environment. The load lock is sealable both from the main chamber and the external environment of the machine.

These above incorporated patents also disclose a mechanism for transporting unprocessed semiconductor wafers from the external environment and into a holder within the load lock, and removing processed wafers from the load lock to the external environment.

These patents explain in detail the operation of the wafer handling mechanism, the structure and operation of the load lock, the structure and operation of the mechanism for moving a wafer supported in a holder between the load lock and stations within the main processing chamber, and the structure for isolating the load lock from the main processing chamber.

FIGS. 1 and 2 represent devices of the prior art and other devices which are constructed without the features of the present invention. FIGS. 3 and 4 represent a load lock incorporating the features of the present invention. FIG. 5 illustrates a load lock having the features of the load lock of FIGS. 1 and 2, and, in addition, having the structure of the load lock of FIGS. 3 and 4 which functions in accordance with the present invention.

As illustrated in FIG. 5, a load lock 10 is provided in a wall 11 of a wafer processing apparatus 12. The wall 11 encloses an internal main processing vacuum chamber 13 which is preferably maintained continuously at an internal vacuum pressure level and which usually contains a gas other than air. In a sputter processing apparatus, for example, where the gas in the internal environment 13 is to be ionized in the course of a coating or etching process, the gas may be typically an inert gas such as argon. An external environment 14, which is usually air at atmospheric pressure, surrounds the apparatus 12 and lies outside of the main chamber wall 11 of the apparatus 12.

The load lock 10 encloses an intermediate transfer or load lock chamber 15 between the internal environment 13 and the external environment 14. The load lock 10 has, located on the side thereof toward the external environment 14, a load lock door 16 which, when open, permits passage of the articles to be processed between the load lock chamber 15 and the external environment 14. The door 16 sealably closes to isolate the external environment 14 from the environment within the load lock chamber 15. The load lock 10 is also provided with a closable entry 17 through which wafers or other substrate articles are moved between the load lock chamber 15 and the internal environment 13 of the main chamber where they are processed. The entry 17 is illustrated as sealed in FIG. 5 between a movable chamber section 18 which clamps a wafer holder support and sealing ring 19 against the wall 11 around the chamber door 16.

An article such as a semiconductor wafer 20 is supported in the load lock chamber 15 in a holder 21 carried by the ring 19. The ring 19 is in turn resiliently mounted on a rotatable index plate 22 which is in the main chamber 13. The chamber section 18 is retractable away from the wall 11 so as to open the entry 17 between the load lock chamber 15 and the main chamber 13 to allow the wafer 20 in the holder 21 to be moved edgewise between the load lock chamber 15 and a processing station within the main chamber 13 as the plate 22 rotates.

The load lock 10 is provided with an exhaust port 23 to which is connected a vacuum pump 24 for pumping the load lock chamber 15 to the vacuum pressure level of the internal environment of the main chamber 13. The load lock 10 is also provided with a vent port 25 for venting or refilling the load lock chamber 15 so as to restore the pressure within the load lock chamber to that of the external atmosphere 14.

An unprocessed wafer 20 is introduced from the external atmosphere 14 into the internal environment of the main chamber 13 through the opened load lock door 16 while the entry or passage 17 between the load lock chamber 15 and the main chamber 13 is sealed. A processed wafer 20 is transferred through the open door 16 between the load lock chamber 15 of the load lock 10 and the external environment 14. The transfer of the wafer 20 between the external environment 14 and the load lock chamber 15 including the method and the mechanism for so transferring the wafers is disclosed in the commonly assigned U.S. Pat. No. 4,915,564 incorporated by reference above.

When the wafer is with the environment 15 of the chamber 10 and the chamber door 16 is closed, sealing the internal environment 15 from the external environment 14, the load lock chamber 15 is pumped to the same pressure level as the internal environment of the main chamber 13. The pump 24 evacuates the load lock chamber 10 through the exhaust port 23. The pumping of the load lock chamber 10 may also be accompanied by the injection of replacement gas through the vent port 25 of the load lock chamber 10 so that the near vacuum pressure level ultimately achieved in the load lock chamber 10 is the same gas composition as that of the internal environment 13.

Once the load lock 10 has been pumped and the environment of the load lock chamber 15 is at the pressure level of the main chamber environment 13, the load lock 10 is opened to the internal environment of the main chamber 13 and the wafer 20 are moved to the main chamber 13, where they step through a plurality of processing stations within the main chamber 13, for processing. A sputter processing apparatus and the method of transferring the wafers 20 from the load lock throughout the main chamber 13 are described in the commonly assigned U.S. Pat. No. 4,909,695 incorporated above by reference.

The transfer of wafers from the main chamber 13 to the external environment 14 need not take place through the same load lock as the passage of wafers from the external environment 14 to the main chamber 13. Preferably, however, a single load lock 10 is used for the transfer of wafers in both directions, with processed and unprocessed wafers being exchanged in the load lock. For purposes of describing the present invention, a single load lock is therefore described for both purposes.

For transfer of a wafer 20 from the main chamber 13 to the external environment 14, the load lock 10 is opened to the main chamber 13 so that the wafer 20 moves from the main chamber 13 to the load lock chamber 15 through the entry 17. In the preferred apparatus 12 described in the patents incorporated above, a processed wafer is transferred from the main chamber 13 to the load lock chamber 15 simultaneously with the transfer of an unprocessed wafer from the load lock chamber 15 to the main chamber 13 as the plate 22 rotates, thereby exchanging one wafer 20, ring 19 and holder 21 with another in the load lock chamber 15.

When a processed wafer 20 is positioned in the load lock 10 for transfer to the external environment 14, and the load lock chamber environment 15 is isolated from that of the main chamber 13, vent gas is released through a valve 26 into the chamber 15 to allow the pressure within the chamber 15 to rise to that of the external environment 14. Once the pressures have been equalized in the chamber 15 with respect to the external environment 14, the load lock door 16 is opened and the wafer 20 is removed from the load lock 10.

Referring to FIGS. 1-2, solid particulates 27, which have a tendency to collect on various surfaces within the chamber 15 of the load lock 10, are illustrated as they would be found in load lock chambers of the prior art. The wafer 20 in the chamber 15 has a device surface 28 on one side thereof on which are to be formed a number of semiconductor devices. The particles 27, when allowed to migrate to the device surface 28 of the wafer 20, cause defects in devices formed during processing. This is particularly a problem upon entry of the wafers into the main chamber 13, as illustrated in FIG. 1, but also occurs with respect to wafers being removed from the main chamber 13, as shown in FIG. 2, in that such wafers may go from the load lock chamber 15 and the apparatus 12 to other devices where the particles also interfere with further processing.

In the prior art, both the venting of the load lock chamber 15 (FIG. 1) and the pumping of the load lock chamber (FIG. 2) cause a turbulent flow of gas within the internal environment 15 of the chamber 10. The turbulent gas flow dislodges particles 27 from the internal surfaces within the load lock 10 and moves dislodged particles through the environment in the load lock chamber 15. Some of the gas borne particles alight upon the device surface 28 of the wafer 20, each of which is capable of damaging one of the semiconductor devices. Where the wafer 20 is an 8" diameter circular wafer being formed into a large number of semiconductor devices, for example, approximately 40 to 50 defective devices may result from the particles which alight on the device surface 21.

Referring to FIGS. 3-5, according to the principles of the present invention, the load lock chamber 10 is provided with a guide or plate 30 which is closely spaced adjacent, and substantially parallel, to the device surface 28 of the wafer 20 so as to form a gap 31 therebetween which covers the device surface 28 of the wafer 20. The plate 30 is preferably circular and at least as large as the device surface 28 of the wafer 20. Since plate 30 is generally planar and parallel to the wafer device surface 28, the gap formed therewith is of uniform thickness. The plate 30 may also be a surface of another structure similarly positioned such as a frontplane heater, where one is provided. With the preferred embodiment of the present invention, however, a vent line 33 is connected between the vent inlet port 25 and an orifice 35 in the guide plate 30 over the device surface 29. Preferably, the orifice 35 is centrally located on the plate 30, to communicate some or all of the vent gas from the inlet 25 to the gap 31 during both the venting (FIG. 3) and the pumping (FIG. 4) of the load lock chamber 10.

According to the preferred embodiment of the invention, a vent gas, such as nitrogen, is introduced into the lock lock chamber 15 at a pressure of 1 to 3 psi more than that of the load lock chamber 15 through the duct 33 and centrally into, and radially outwardly from, the gap 31 during the venting process of FIG. 3 to bring the load lock chamber 15 to atmospheric pressure in about ten seconds. Since the load lock chamber is about 1.5 liters in volume, the average flow rate for refilling the chamber is about 9 liters per minute. At all times that gases are flowing to or from the load lock chamber 10, a flow of clean vent gas is maintained in a direction radially outwardly away from the gap 31 around the full perimeter of the device surface 21 of the wafer 20. This is shown by the arrows 37. This outward flow of gas is maintained in an outward direction around the perimeter of the device surface 21 by maintaining the pressure of the clean gas at the orifice 35 sufficiently in excess of the pressure in the chamber 15 around the edge of the gap 31. In this manner, particulates 27 which are picked up from the internal surfaces of the load lock chamber 15 are still carried by the turbulent air, but are instead deflected or otherwise prevented from contacting the device surface 29 or entering the gap 31 by the radially outwardly flow of clean vent gas as shown by arrows 37. The vent gas entering the inlet port 24 may be typically, for example, nitrogen gas from a source 40 which is passed through a filter 41, preferably a 0.02 micrometer filter to remove particulates therefrom, then through a clean valve, 43 which controls the flow of the gas from the source 40 into an electropolished no bend gas line 45 which communicates with the inlet port 24 to the load lock chamber 10. A pump 48 is connected to the outlet port 23 to remove the gas from the chamber during pumping (FIG. 4).

It will be appreciated that, while specific embodiments and applications of the present invention have been illustrated and described, variations thereof may be made without departing from the principles of the present invention. Accordingly, the following is claimed:

I claim:

1. A method of protecting a surface of a substrate supported in a chamber of a processing apparatus from particulate contamination borne by a gas during the turbulent flow of the gas in the chamber, the surface being bounded by an edge, the method comprising the steps of:
   pumping or venting the chamber from one pressure to another at a rate sufficiently rapid to cause turbulent flow of gas therein;
   forming, with a guide plate spaced from and positioned adjacent and parallel to a surface to be protected of a substrate supported in the chamber, a gap substantially completely covering the surface to be protected, the gap having a periphery disposed outwardly of the edge of the surface to be protected; and
   introducing, during the pumping or venting of the chamber, a clean gas into the gap though an orifice in the guide plate at a pressure sufficient to maintain a flow of the gas outwardly from the gap at the periphery thereof and into the chamber during the turbulent flow of gas within the chamber so as to limit the flow of turbulent gas borne particulates from the chamber, into the gap and onto the surface to be protected.

2. The method of claim 1 further comprising the step of:
   alternately venting the chamber to the pressure of an external environment and pumping the chamber to the pressure of an internal environment;
   performing the clean gas introducing step during both the venting and pumping of the chamber.

3. The method of claim 1 wherein:
   the introducing step includes the step of introducing the gas at a pressure sufficient to produce a pressure at the periphery of the gap that exceeds the pressure of the chamber, thereby maintaining the flow of clean gas outwardly from the gap periphery.

4. The method of claim 1 wherein:
   the clean gas is introduced into the gap by way of a centrally disposed opening in the plate to establish the gas flow in the gap radially outwardly in all directions.

5. A method of raising the pressure of a chamber by filling the chamber with a gas comprising the steps of:
   supporting in a chamber maintained at a vacuum pressure level a substrate having a surface thereon to be protected from contamination;
   forming a gap adjacent to and covering the surface to be protected, the gap having a periphery encircling the surface to be protected;
   flowing gas into the chamber and increasing the pressure in the chamber thereby;
   during the increasing of the pressure in the chamber, introducing a gas that is relatively clean of contaminants from which the surface is to be protected into the gap; and
   guiding the gas, while it is being so introduced, along the surface to be protected and through the gap so as to flow outwardly at the periphery of the gap into a chamber to thereby inhibit the entry of contamination, borne by the flowing gas, from the chamber into the gap and onto the surface to be protected.

6. The method of claim 5 wherein:
   the guiding step includes the step of guiding the introduced gas with a plate positioned adjacent the surface to be protected.

7. The method of claim 6 wherein:
   the introducing step includes the step of introducing the gas through an orifice in the plate.

8. The method of claim 5 wherein:

the introducing step includes the step of introducing the gas at a pressure sufficient to produce a pressure around the periphery of the gap that exceeds the pressure of the chamber, thereby maintaining the flow of clean gas outwardly from the gap periphery.

9. The method of claim 6 wherein:

the clean gas is introduced into the gap by way of a centrally disposed opening in the plate to establish the gas flow in the gap radially outwardly in all directions.

10. A method of pumping gas from a chamber to lower the pressure in the chamber to a vacuum pressure level, the method comprising the steps of:

supporting in a chamber a substrate having a surface thereon to be protected from contamination;

forming a gap adjacent to and covering the surface to be protected, the gap having a periphery encircling the surface to be protected;

pumping gas from the chamber at a predetermined flow rate to lower the pressure thereof and until the chamber has reached the vacuum pressure level;

introducing a gas relatively clean of contaminants from which the surface is to be protected into the gap, while pumping gas from the chamber to lower the pressure thereof, and at a flow rate less than the predetermined flow rate; and guiding the clean gas, while it is being so introduced, along the surface to be protected and through the gap so as to flow outwardly at the periphery of the gap into the chamber to thereby inhibit the entry of contamination borne by gas within the chamber into the gap and onto the surface to be protected.

11. The method of claim 10 wherein:

the guiding step includes the step of guiding the introduced gas with a plate positioned adjacent the surface to be protected.

12. The method of claim 11 wherein:

the introducing step includes the step of introducing the clean gas through an orifice in the plate.

13. The method of claim 12 wherein:

the introducing step includes the step of introducing the gas at a pressure sufficient to produce a pressure around the periphery of the gap that exceeds the pressure of the chamber, thereby maintaining the flow of clean gas outwardly from the gap periphery.

14. The method of claim 10 wherein:

the clean gas is introduced into the gap by way of a centrally disposed opening in the plate to establish the gas flow in the gap radially outwardly in all directions.

15. A method of operating a chamber through a cycle which includes the pumping of the chamber according to the method of claim 10 and further comprises the steps of:

venting the chamber, subsequent to the pumping thereof, to raise the pressure from the vacuum pressure level by introducing a gas relatively clean of contaminants from which the surface is to be protected into the gap; and guiding the introduced clean gas, during the venting step, along the surface to be protected and through the gap so as to flow outwardly at the periphery of the gap into the chamber.

16. The method of claim 15 wherein:

the guiding steps each include the step of guiding the introduced gas with a plate positioned adjacent the surface to be protected.

17. The method of claim 16 wherein:

the introducing steps each include the step of introducing the clean gas through an orifice in the plate.

18. The method of claim 17 wherein:

each of said introducing steps includes a step of introducing the gas at a pressure sufficient to produce a pressure around the periphery of the gap that exceeds the pressure of the chamber, thereby maintaining the flow of clean gas outwardly from the gap periphery.

19. A method of evacuating a chamber to a predetermined lower pressure level comprising the steps of:

supporting in a chamber a substrate having a surface thereon to be protected;

forming a gap adjacent to and covering the surface to be protected, the gap having a periphery encircling the surface to be protected;

removing gas from the chamber to lower the pressure thereof, at a predetermined flow rate that is sufficient rapid to cause contaminants to become borne by the gas within the chamber and until the chamber has reached the lower pressure level;

introducing a gas that is relatively clean of contaminants from which the surface is to be protected into the gap while removing gas from the chamber to lower the pressure thereof and t a flow rate less than the predetermined flow rate; and guiding the clean gas, while it is being so introduced, along the surface to be protected and through the gap so as to flow outwardly at the periphery of the gap into the chamber.

20. A method of operating a chamber through a cycle which includes the evacuating of the chamber according to the method of claim 19 and further comprises the steps of:

thereafter filling the chamber to raise the pressure thereof by flowing as into the chamber at a rate sufficient rapid to cause contaminants to become borne by the gas within the chamber;

during the filling step, introducing a gas that is relatively clean of contaminants from which the surface is to be protected into the gap; and guiding the introduced clean gas, during the filling step, along the surface to be protected and through the gap so as to flow outwardly at the periphery of the gap into the chamber.

21. A load lock, for an apparatus having a processing chamber in which substrates having at least one surface thereon to be protected from contamination are processed in an internal environment isolated from an external environment, the load lock comprising:

a wall enclosing a load lock chamber and having a door therein for alternately opening the load lock chamber to, and sealing the load lock chamber from, the external environment, said wall having a sealable entry therein for alternately opening the load lock chamber to, and sealing the load lock chamber from, the internal environment;

a substrate holder for supporting a substrate in the load lock chamber;

a gas inlet port and a gas outlet port, said ports communicating with the load lock chamber, one of the ports being a vent port for venting the chamber to the pressure of the external environment, and the other of the ports being a pump port for pumping the chamber to the pressure of the internal environment;

chamber pressure changing means, connected to said ports and operative when said chamber is sealed, for causing gas to flow through one of said ports, at a rate sufficiently rapid to cause contaminants to be borne by gas in the chamber, to change the pressure within said chamber between that of the internal and external environments;

a guide having an orifice therein and positioned to lie spaced from, adjacent and parallel to the surface to be protected of a substrate mounted on the support to form a gap covering the surface to be protected, the gap having a periphery surrounding the surface to be protected;

a supply of gas relatively clean of contaminants from which the surface of the substrate is to be protected; and clean gas introducing means, connected to said orifice and said supply, for causing gas from said clean gas supply to flow from said orifice, through said gap and into said chamber and to maintain the pressure along said periphery greater than the pressure in the chamber, while gas is flowing through said one of said ports during the operation of said pressure changing means, to thereby inhibit the flow of contaminants borne by the gas in the chamber from entering the gap and contaminating the surface of the wafer.

22. The apparatus of claim 21:

said clean gas introducing means includes means for introducing clean gas into the gap though the orifice in the guide plate at a pressure sufficient to maintain a flow of the clean gas outwardly from the gap at the periphery thereof and into the load lock chamber whenever a substrate is supported in the load lock chamber and gas is turbulently flowing within the load lock chamber, to thereby limit the flow of gas borne contaminants from the chamber, into the gap and onto the surface to be protected of a substrate supported in the load lock chamber.

23. The apparatus method of claim 22 wherein:

the introducing means is operative to introduce the flow of vent gas through said orifice at a pressure sufficient to produce pressure around the periphery of the gap that exceeds the pressure of the chamber, thereby maintaining the flow of clean gas outwardly from the gap periphery.

24. The apparatus of claim 21 wherein:

the orifice in the plate is centrally disposed therein for introducing gas at the center of the gap and through the gap into the load lock chamber.

25. A processing apparatus in which substrates having at least one surface thereon to be protected from particulate contamination are processed in an internal environment isolated from an external environment, the apparatus comprising:

a chamber sealable from the external environment and having a substrate holder for supporting a substrate in the chamber;

a gas inlet port and a gas outlet port, said ports communicating with the chamber, one of said ports being a vent port for venting the chamber to the pressure of the external environment, and the other of said ports being a pump port for pumping the chamber to the pressure of the internal environment;

means for changing the pressure within the chamber between that of the internal environment and that of the external environment, including means for causing gas to flow through one of said ports at a rate sufficiently rapid to cause the turbulent flow of gas within said chamber;

a guide having an orifice therein positioned to lie adjacent and parallel to and closely spaced from the surface to be protected of a substrate mounted on the holder to form a narrow gap covering the surface to be protected with the periphery of the gap surrounding the orifice and the surface to be protected;

means for supplying a gas at the orifice that is relatively clean of contaminants from which the surface of the substrate is to be protected; and means for introducing clean gas from said gas supplying means into the gap though the orifice in the guide plate at a pressure that is sufficient to produce pressure around the periphery of the gap that exceeds the pressure of the chamber and decreases from the orifice to the periphery of the gap and is sufficient to maintain a flow of the clean gas outwardly from the gap at the periphery thereof and into the chamber when a substrate is supported in the chamber and gas is turbulently flowing within the chamber and pressure is changing therein, so as to thereby limit the flow of turbulent gas borne particulates from the chamber, into the gap and onto the surface to be protected of the substrate supported in the chamber, thereby maintaining the flow of clean gas outwardly from said gap periphery.

26. A method of protecting, from contaminants borne by a gas while gas is flowing into or out of a chamber of a processing apparatus to change the pressure therein, a surface, to be processed in the apparatus, of a substrate supported in the chamber, the surface being bounded by an edge the method comprising the steps of:

pumping or venting the chamber from one pressure to another at a rate sufficiently rapid to carry contaminants borne by the gas onto unprotected surfaces within the chamber;

forming, with a guide plate spaced from and positioned adjacent and parallel to the surface to be protected, a narrow and substantially uniform gap substantially completely covering the surface to be protected; and introducing, during the pumping or venting of the chamber, a clean gas into the gap though an orifice in the guide plate at a pressure sufficient to maintain a flow of the clean gas along the surface, across the edge, outwardly from the gap, and into the chamber during the pumping or venting of the chamber.

27. A processing apparatus in which substrates having at least one surface thereon to be protected from contamination and to be processed in an internal environment isolated from an external environment are supported, the apparatus comprising:

a chamber sealable from the external environment and having a substrate holder for supporting in the chamber a substrate having the surface thereon to be protected;

a gas inlet port and a gas outlet port communicating with the chamber, one port being a vent port for venting the chamber to the pressure of the external environment, and the other port being a pump port for pumping the chamber to the pressure of the internal environment;

means for changing the pressure within the chamber between that of the internal and that of the external environment, including means for causing gas to flow through one of said ports at a rate sufficiently rapid to cause contaminants borne by gas flowing within said chamber to be carried to unprotected surfaces within the chamber;

a guide closely spaced from and positioned parallel to the surface to be protected and forming with the surface to be protected a narrow gap completely covering the surface to be protected, the gap having a periphery lying outwardly of the surface to be protected, the guide having an orifice therein;

means for supplying to the orifice a surface protecting gas that is relatively clean of contaminants from which the surface of the substrate is to be protected; and means for flowing the surface protecting gas from the gas supplying means through the orifice and the gap at a pressure that is sufficient to maintain a flow of the surface protecting gas from the orifice, through the gap and outwardly at the periphery of the gap and into the chamber, the surface protecting gas flowing means being operable when a substrate is supported in the chamber and pressure is changing therein, so as to thereby limit the flow of gas borne contaminants from the chamber, into the gap and onto the surface to be protected.

* * * * *